US012591173B2

(12) United States Patent
Suzuki et al.

(10) Patent No.: US 12,591,173 B2
(45) Date of Patent: Mar. 31, 2026

(54) SUBSTRATE WITH MULTILAYER REFLECTIVE FILM, REFLECTIVE MASK BLANK, REFLECTIVE MASK, AND METHOD FOR MANUFACTURING SEMICONDUCTOR DEVICE

(71) Applicant: HOYA CORPORATION, Tokyo (JP)

(72) Inventors: Kota Suzuki, Tokyo (JP); Masanori Nakagawa, Tokyo (JP); Takahiro Onoue, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 675 days.

(21) Appl. No.: 17/913,099

(22) PCT Filed: Mar. 22, 2021

(86) PCT No.: PCT/JP2021/011620
§ 371 (c)(1),
(2) Date: Sep. 20, 2022

(87) PCT Pub. No.: WO2021/200325
PCT Pub. Date: Oct. 7, 2021

(65) Prior Publication Data
US 2023/0133304 A1　May 4, 2023

(30) Foreign Application Priority Data
Mar. 30, 2020　(JP) ................................. 2020-059743

(51) Int. Cl.
*G03F 1/24* (2012.01)
*G03F 1/48* (2012.01)
*G03F 1/54* (2012.01)
(52) U.S. Cl.
CPC ................. *G03F 1/24* (2013.01); *G03F 1/48* (2013.01); *G03F 1/54* (2013.01)

(58) Field of Classification Search
CPC ..... G03F 1/24; G03F 1/48; G03F 1/54; G03F 1/80
See application file for complete search history.

(56) References Cited

U.S. PATENT DOCUMENTS

| | | | |
|---|---|---|---|
| 2002/0045108 A1 | 4/2002 | Lee et al. | |
| 2006/0270226 A1 | 11/2006 | Hosoya | |
| | (Continued) | | |

FOREIGN PATENT DOCUMENTS

| | | | |
|---|---|---|---|
| JP | 2002122981 A | 4/2002 | |
| JP | 2006332153 A | 12/2006 | |
| | (Continued) | | |

OTHER PUBLICATIONS

PCT/JP2021/011620, "English Translation of International Search Report", May 18, 2021, 2 pages.
(Continued)

*Primary Examiner* — Stewart A Fraser
(74) *Attorney, Agent, or Firm* — Sughrue Mion, PLLC

(57) ABSTRACT

Provided are a substrate with a multilayer reflective film, a reflective mask blank, a reflective mask, and a method for manufacturing a semiconductor device, having high resistance to an etching gas used for etching an absorber film and/or an etching mask film and capable of suppressing occurrence of blister.

A substrate with a multilayer reflective film 100 comprises a substrate 10, a multilayer reflective film 12 formed on the substrate 10, and a protective film 14 formed on the multilayer reflective film 12. The protective film 14 comprises ruthenium (Ru), rhodium (Rh), and at least one additive element selected from the group consisting of titanium (Ti), zirconium (Zr), yttrium (Y), niobium (Nb), vanadium (V), and hafnium (Hf).

19 Claims, 3 Drawing Sheets

(56)     References Cited

U.S. PATENT DOCUMENTS

| | | | |
|---|---|---|---|
| 2016/0147139 A1* | 5/2016 | Onoue | ...................... G03F 1/76 |
| | | | 430/311 |
| 2016/0202601 A1 | 7/2016 | Onoue | |
| 2018/0356719 A1* | 12/2018 | Ikebe | ........................ G03F 1/46 |

FOREIGN PATENT DOCUMENTS

| | | |
|---|---|---|
| JP | 2014170931 A | 9/2014 |
| JP | 2016033956 A | 3/2016 |
| KR | 10-2016-0034315 A | 3/2016 |
| WO | 2015012151 A1 | 1/2015 |
| WO | 2015037564 A1 | 3/2015 |

OTHER PUBLICATIONS

Communication dated Dec. 18, 2024 issued by the Intellectual Property Office of Singapore in application No. 1120253577A.
Korean Office Action dated Jul. 1, 2025 in Application No. 10-2022-7025437.

* cited by examiner

SUBSTRATE WITH MULTILAYER REFLECTIVE FILM, REFLECTIVE MASK BLANK, REFLECTIVE MASK, AND METHOD FOR MANUFACTURING SEMICONDUCTOR DEVICE

CROSS-REFERENCE TO RELATED APPLICATIONS

This application is the National Stage of International Application No. PCT/JP2021/011620, filed Mar. 22, 2021, which claims priority to Japanese Patent Application No. 2020-059743, filed Mar. 30, 2020, and the contents of which is incorporated by reference.

TECHNICAL FIELD

The present disclosure relates to a substrate with a multilayer reflective film, a reflective mask blank, a reflective mask, and a method for manufacturing a semiconductor device.

BACKGROUND ART

With a further demand for higher density and higher accuracy of a VLSI device in recent years, EUV lithography, which is an exposure technique using extreme ultraviolet (hereinafter, referred to as "EUV") light, is promising. The EUV light refers to light in a wavelength band of a soft X-ray area or a vacuum ultraviolet area, and specifically refers to light having a wavelength of about 0.2 to 100 nm.

The reflective mask includes a multilayer reflective film for reflecting exposure light formed on a substrate, and an absorber pattern which is a patterned absorber film formed on the multilayer reflective film for absorbing exposure light. Light incident on the reflective mask mounted on an exposure machine for performing pattern transfer on a semiconductor substrate is absorbed in a portion with the absorber pattern and is reflected by the multilayer reflective film in a portion without the absorber pattern. A light image reflected by the multilayer reflective film is transferred onto the semiconductor substrate such as a silicon wafer through a reflective optical system.

In order to achieve high density and high accuracy of a semiconductor device using the reflective mask, it is necessary for a reflection area (surface of the multilayer reflective film) in the reflective mask to have a high reflectance with respect to EUV light that is exposure light.

As the multilayer reflective film, a multilayer film in which layers containing elements having different refractive indices are periodically layered is generally used. For example, as a multilayer reflective film with respect to EUV light having a wavelength of 13 to 14 nm, a Mo/Si periodic layered film in which a Mo film and a Si film are alternately layered for about 40 periods is preferably used.

Examples of a reflective mask used for EUV lithography include a reflective mask described in Patent Document 1. Patent Document 1 describes a reflective photomask including a substrate, a reflection layer formed on the substrate and formed of a multilayer film in which two different types of films are alternately layered, a buffer layer formed on the reflection layer and formed of a ruthenium film, and an absorber pattern formed on the buffer layer in a predetermined pattern shape and formed of a material capable of absorbing a soft X-ray. The buffer layer described in Patent Document 1 is also generally called a protective film.

Patent Document 2 describes a substrate with a multilayer reflective film having a multilayer reflective film that reflects exposure light on the substrate. Patent Document 2 also describes that a protective film for protecting the multilayer reflective film is formed on the multilayer reflective film, and the protective film is a protective film in which a reflectance reduction suppressing layer, a blocking layer, and an etching stopper layer are layered in this order. Patent Document 2 also describes that the etching stopper layer is made of ruthenium (Ru) or an alloy thereof, and specific examples of the alloy of ruthenium include a ruthenium niobium (RuNb) alloy, a ruthenium zirconium (RuZr) alloy, a ruthenium rhodium (RuRh) alloy, a ruthenium cobalt (RuCo) alloy, and a ruthenium rhenium (RuRe) alloy.

Patent Documents 3 and 4 describe a substrate with a multilayer reflective film including a substrate, a multilayer reflective film, and a Ru-based protective film for protecting the multilayer reflective film, formed on the multilayer reflective film. Patent Documents 3 and 4 describe that a surface layer of the multilayer reflective film on a side opposite to the substrate is a layer containing Si.

Patent Document 3 describes that a block layer that hinders migration of Si to the Ru-based protective film is formed between the multilayer reflective film and the Ru-based protective film. Patent Document 3 describes that examples of a constituent material of the Ru-based protective film include Ru and an alloy material thereof, and a Ru compound containing Ru and at least one metal element selected from the group consisting of Nb, Zr, Rh, Ti, Co, and Re is suitable as the alloy of Ru.

Patent Document 4 describes that the Ru-based protective film contains a Ru compound containing Ru and Ti, and the Ru compound contains Ru in a larger amount than RuTi having a stoichiometric composition.

PRIOR ART DOCUMENTS

Patent Documents

Patent Document 1: JP 2002-122981 A
Patent Document 2: JP 2014-170931 A
Patent Document 3: WO 2015/012151 A
Patent Document 4: WO 2015/037564 A

DISCLOSURE OF DISCLOSURE

In a process of manufacturing a reflective mask, when an absorber pattern is formed, an absorber film is processed by etching via a resist pattern or an etching mask pattern. In order to process the absorber film into a designed shape, it is necessary to slightly over-etch the absorber film. At the time of over-etching, a multilayer reflective film under the absorber film is also damaged by etching. In order to prevent the multilayer reflective film from being damaged by etching, a protective film is formed between the absorber film and the multilayer reflective film. Therefore, the protective film is required to have high resistance to an etching gas used for etching the absorber film.

As a material of the protective film having high resistance to the etching gas of the absorber film, for example, Ru or RuNb is used. When the etching mask film formed on the absorber film is made of a Cr-based material, a mixed gas of a chlorine gas and an oxygen gas is used as the etching gas in order to peel off the etching mask film. The Ru or RuNb protective film has low resistance to a mixed gas containing an oxygen gas. Therefore, when the etching mask film is peeled off, the multilayer reflective film formed under the protective film may be damaged. In addition, the protective film damaged when the etching mask film is peeled off may have insufficient resistance in a subsequent absorber pattern correction step.

In EUV lithography, it is known that exposure contamination such as carbon film deposition on a reflective mask due to EUV exposure occurs. In order to suppress this exposure contamination, in recent years, a technique of introducing a hydrogen gas into an atmosphere during exposure has been adopted. The present inventors have found that when a hydrogen gas is introduced into an atmosphere during exposure, a phenomenon occurs in which an absorber film floats up and is peeled off from a surface of a protective film. Furthermore, the present inventors have found that a phenomenon occurs in which the protective film floats up and is peeled off from a surface of a multilayer reflective film (hereinafter, such a film peeling phenomenon is referred to as "blister"). The present inventors have found that particularly when the absorber film is made of a material containing Ta, such a phenomenon significantly occurs because Ta easily adsorbs hydrogen. Therefore, the protective film is also required to solve the problem of blister.

Therefore, an aspect of the present disclosure is to provide a substrate with a multilayer reflective film, a reflective mask blank, a reflective mask, and a method for manufacturing a semiconductor device, having high resistance to an etching gas used for etching an absorber film and/or an etching mask film and capable of suppressing occurrence of blister.

In order to solve the above problems, the present disclosure has the following configurations.
(Configuration 1)

A substrate with a multilayer reflective film comprising: a substrate, a multilayer reflective film formed on the substrate, and a protective film formed on the multilayer reflective film, in which the protective film comprises ruthenium (Ru), rhodium (Rh), and at least one additive element selected from the group consisting of titanium (Ti), zirconium (Zr), yttrium (Y), niobium (Nb), vanadium (V), and hafnium (Hf).
(Configuration 2)

The substrate with a multilayer reflective film according to configuration 1, in which the content of the rhodium (Rh) is 15 atomic % or more and 50 atomic % or less.
(Configuration 3)

The substrate with a multilayer reflective film according to configuration 1 or 2, in which the content of the additive element is 1 atomic % or more and 20 atomic % or less.
(Configuration 4)

The substrate with a multilayer reflective film according to configuration 3, in which the additive element is titanium (Ti), and the content of the Ti is 1 atomic % or more and 10 atomic % or less.
(Configuration 5)

The substrate with a multilayer reflective film according to configuration 3, in which the additive element is zirconium (Zr), and the content of the Zr is 1 atomic % or more and 10 atomic % or less.
(Configuration 6)

The substrate with a multilayer reflective film according to any one of configurations 1 to 5, in which the protective film comprises a Si material layer comprising silicon (Si) on a side in contact with the multilayer reflective film.

(Configuration 7)

A reflective mask blank comprising an absorber film on the protective film of the substrate with a multilayer reflective film according to any one of configurations 1 to 6.
(Configuration 8)

A reflective mask comprising an absorber pattern in which the absorber film in the reflective mask blank according to configuration 7 is patterned.
(Configuration 9)

A method for manufacturing a semiconductor device, comprising performing a lithography process using an exposure apparatus using the reflective mask according to configuration 8 to form a transfer pattern on a transferred object.

The present disclosure can provide a substrate with a multilayer reflective film, a reflective mask blank, a reflective mask, and a method for manufacturing a semiconductor device, having high resistance to an etching gas used for etching an absorber film and/or an etching mask film and capable of suppressing occurrence of blister.

DESCRIPTION OF EMBODIMENTS

Hereinafter, an embodiment of the present disclosure will be specifically described with reference to the drawings. Note that the following embodiment is a mode for specifically describing the present disclosure and does not limit the present disclosure within the scope thereof.

Figure 1:
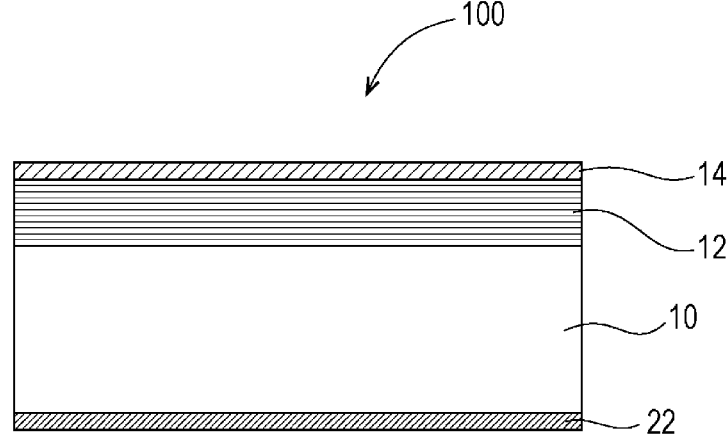
FIG. 1 is a schematic cross-sectional view illustrating an example of a substrate with a multilayer reflective film of the present embodiment.

FIG. 1 is a schematic cross-sectional view illustrating an example of a substrate with a multilayer reflective film 100 of the present embodiment. The substrate with a multilayer reflective film 100 illustrated in FIG. 1 includes a substrate 10, a multilayer reflective film 12 formed on the substrate 10, and a protective film 14 formed on the multilayer reflective film 12. A conductive back film 22 for an electrostatic chuck may be formed on a back surface of the substrate 10 (surface opposite to the side where the multilayer reflective film 12 is formed).

Note that here, "on" a substrate or a film includes not only a case of being in contact with a top surface of the substrate or the film but also a case of being not in contact with the top surface of the substrate or the film. That is, "on" a substrate or a film includes a case where a new film is formed above the substrate or the film, a case where another film is interposed between the substrate or the film and an object "on" the substrate or the film, and the like. In addition, "on" does not necessarily mean an upper side in the vertical direction. "On" merely indicates a relative positional relationship among a substrate, a film, and the like.

<Substrate>

As the substrate 10, a substrate having a low thermal expansion coefficient within a range of 0±5 ppb/° C. is preferably used in order to prevent distortion of a transfer pattern due to heat during exposure to EUV light. As a material having a low thermal expansion coefficient within this range, for example, $SiO_2$—$TiO_2$-based glass, multicomponent-based glass ceramics, or the like can be used.

A main surface of the substrate 10 on a side where a transfer pattern (an absorber pattern described later) is formed is preferably processed in order to increase a flatness. By increasing the flatness of the main surface of the substrate 10, position accuracy and transfer accuracy of the pattern can be increased. For example, in a case of EUV exposure, the flatness in an area of 132 mm×132 mm of the main surface of the substrate 10 on the side where the transfer pattern is formed is preferably 0.1 μm or less, more preferably 0.05 μm or less, and particularly preferably 0.03 μm or less. The main surface (back surface) opposite to the side where the transfer pattern is formed is a surface fixed to the exposure apparatus by an electrostatic chuck. The flatness in an area having a size of 142 mm×142 mm of the back surface is preferably 0.1 μm or less, more preferably 0.05 μm or less, and particularly preferably 0.03 μm or less. Note that here, the flatness is a value indicating surface warpage (deformation amount) represented by total indicated reading (TIR). Specifically, the flatness is an absolute value of a difference in height between the highest position of a substrate surface above a focal plane and the lowest position of the substrate surface below the focal plane, in which the focal plane is a plane defined by a minimum square method using the substrate surface as a reference.

In a case of EUV exposure, the main surface of the substrate 10 on the side where the transfer pattern is formed preferably has a surface roughness of 0.1 nm or less in terms of root mean square roughness (Rq). Note that the surface roughness can be measured with an atomic force microscope.

The substrate 10 preferably has high rigidity in order to prevent deformation due to a film stress applied to a film (such as the multilayer reflective film 12) formed on the substrate 10. In particular, the substrate 10 preferably has a high Young's modulus of 65 GPa or more.

<Multilayer Reflective Film>

The multilayer reflective film 12 has a structure in which a plurality of layers mainly containing elements having different refractive indices is periodically layered. In general, the multilayer reflective film 12 is constituted by a multilayer film in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods. In order to form the multilayer reflective film 12, the high refractive index layer and the low refractive index layer may be layered in this order from the substrate 10 side for a plurality of periods. In this case, one (high refractive index layer/low refractive index layer) stack is one period.

Note that an uppermost layer of the multilayer reflective film 12, that is, a surface layer of the multilayer reflective film 12 on a side opposite to the substrate 10 is preferably constituted by the high refractive index layer. When the high refractive index layer and the low refractive index layer are built up in this order from the substrate 10 side, the low refractive index layer forms the uppermost layer. However, when the low refractive index layer forms a surface of the multilayer reflective film 12, the reflectance of the surface of the multilayer reflective film is reduced due to easy oxidation of the low refractive index layer. In this case, the high refractive index layer is preferably formed on the low refractive index layer. Meanwhile, when the low refractive index layer and the high refractive index layer are built up in this order from the substrate 10 side, the high refractive index layer forms the uppermost layer. In this case, the high refractive index layer forming the uppermost layer forms a surface of the multilayer reflective film 12.

In the present embodiment, the high refractive index layer may contain Si. The high refractive index layer may contain a Si simple substance or a Si compound. The Si compound may contain Si and at least one element selected from the group consisting of B, C, N, O, and H. By using the layer containing Si as the high refractive index layer, a multilayer reflective film having an excellent reflectance with respect to EUV light can be obtained.

In the present embodiment, the low refractive index layer may contain at least one element selected from the group consisting of Mo, Ru, Rh, and Pt, or may contain an alloy containing at least one element selected from the group consisting of Mo, Ru, Rh, and Pt.

For example, as the multilayer reflective film 12 for EUV light having a wavelength of 13 to 14 nm, a Mo/Si multilayer film in which a Mo film and a Si film are alternately layered for about 40 to 60 periods can be preferably used. In addition, as the multilayer reflective film used in an area of EUV light, for example, a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, a Si/Ru/Mo/Ru periodic multilayer film, or the like can be used. A material of the multilayer reflective film can be selected considering a light exposure wavelength.

The reflectance of such a multilayer reflective film 12 alone is, for example, 65% or more. An upper limit of the reflectance of the multilayer reflective film 12 is, for example, 73%. Note that the thicknesses and period of layers included in the multilayer reflective film 12 can be selected so as to satisfy Bragg's law.

The multilayer reflective film 12 can be formed by a known method. The multilayer reflective film 12 can be formed by, for example, an ion beam sputtering method.

For example, when the multilayer reflective film 12 is a Mo/Si multilayer film, a Mo film having a thickness of about 3 nm is formed on the substrate 10 by an ion beam sputtering method using a Mo target. Next, a Si film having a thickness of about 4 nm is formed using a Si target. By repeating such an operation, the multilayer reflective film 12 in which Mo/Si films are layered for 40 to 60 periods can be formed. At this time, a surface layer of the multilayer reflective film 12 on a side opposite to the substrate 10 is a layer containing Si (Si film). The Mo/Si film in one period has a thickness of 7 nm.

<Protective Film>

The protective film 14 can be formed on the multilayer reflective film 12 or in contact with a surface of the multilayer reflective film 12 in order to protect the multilayer reflective film 12 from dry etching and cleaning in a process of manufacturing a reflective mask 200 described later. The protective film 14 also has a function of protecting the multilayer reflective film 12 when a black defect in a transfer pattern is corrected using an electron beam (EB). By forming the protective film 14 on the multilayer reflective film 12, damage to the surface of the multilayer reflective film 12 can be suppressed when the reflective mask 200 is manufactured. As a result, a reflectance characteristic of the multilayer reflective film 12 with respect to EUV light is improved.

The protective film 14 can be formed using a known method. Examples of a method for forming the protective film 14 include an ion beam sputtering method, a magnetron sputtering method, a reactive sputtering method, a vapor phase growth method (CVD), and a vacuum vapor deposition method. The protective film 14 may be continuously formed by an ion beam sputtering method after the multilayer reflective film 12 is formed.

In the substrate with a multilayer reflective film 100 of the present embodiment, the protective film 14 contains ruthenium (Ru), rhodium (Rh), and at least one additive element selected from the group consisting of titanium (Ti), zirconium (Zr), yttrium (Y), niobium (Nb), vanadium (V), and hafnium (Hf).

Since the protective film 14 contains ruthenium (Ru) and rhodium (Rh), etching resistance of the protective film 14 to a mixed gas of a chlorine-based gas and an oxygen gas, etching resistance of the protective film 14 to a chlorine-based gas, etching resistance of the protective film 14 to a fluorine-based gas, and sulfuric acid peroxide (SPM) cleaning resistance of the protective film 14 are improved. When the content of Rh in the protective film 14 is too small, an effect of addition thereof cannot be obtained. When the content of Rh in the protective film 14 is too large, an extinction coefficient k of the protective film 14 with respect to EUV light increases, and therefore a reflectance of the reflective mask 200 is reduced. Therefore, the content of Rh in the protective film 14 is preferably 15 atomic % or more and 50 atomic % or less, and more preferably 20 atomic % or more and 40 atomic % or less.

Since the protective film 14 contains ruthenium (Ru), rhodium (Rh), and at least one additive element selected from the group consisting of titanium (Ti), zirconium (Zr), yttrium (Y), niobium (Nb), vanadium (V), and hafnium (Hf), adhesion between the protective film 14 and the multilayer reflective film 12 is improved. Therefore, it is possible to suppress occurrence of blister between the protective film 14 and the multilayer reflective film 12. In addition, since adhesion between the protective film 14 and an absorber film 24 to be described later is improved, occurrence of blister between the protective film 14 and the multilayer reflective film 12 can be prevented. In order to obtain such an effect, the content of the additive element in the protective film 14 is preferably 1 atomic % or more and 20 atomic % or less.

When the protective film 14 contains titanium (Ti) as the additive element (for example, in a case of a RuRhTi film), the content of Ti in the protective film 14 is preferably 1 atomic % or more, and more preferably 2 atomic % or more. In addition, the content of Ti is preferably 10 atomic % or less, and more preferably 7 atomic % or less.

When the protective film 14 contains zirconium (Zr) as the additive element (for example, in a case of a RuRhZr film), the content of Zr in the protective film 14 is preferably 1 atomic % or more, and more preferably 2 atomic % or more. In addition, the content of Zr is preferably 10 atomic % or less, and more preferably 7 atomic % or less.

When the protective film 14 contains yttrium (Y) as the additive element (for example, in a case of a RuRhY film), the content of Y in the protective film 14 is preferably 1 atomic % or more, and more preferably 2 atomic % or more. In addition, the content of Y is preferably 10 atomic % or less, and more preferably 7 atomic % or less.

When the protective film 14 contains niobium (Nb) as the additive element (for example, in a case of a RuRhNb film), the content of Nb in the protective film 14 is preferably 1 atomic % or more, and more preferably 2 atomic % or more. In addition, the content of Nb is preferably 20 atomic % or less, and more preferably 15 atomic % or less.

When the protective film 14 contains vanadium (V) as the additive element (for example, in a case of a RuRhV film), the content of V in the protective film 14 is preferably 1 atomic % or more, and more preferably 2 atomic % or more. In addition, the content of V is preferably 10 atomic % or less, and more preferably 7 atomic % or less.

When the protective film 14 contains hafnium (Hf) as the additive element (for example, in a case of a RuRhHf film), the content of Hf in the protective film 14 is preferably 1 atomic % or more, and more preferably 2 atomic % or more. In addition, the content of Hf is preferably 7 atomic % or less, and more preferably 5 atomic % or less.

Figure 2:
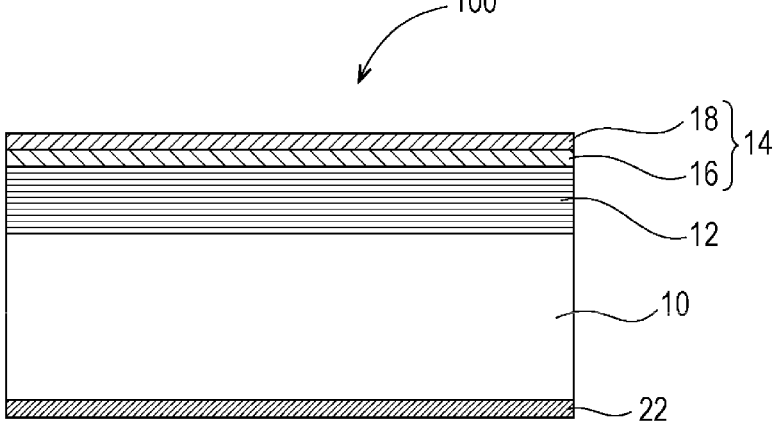
FIG. 2 is a schematic cross-sectional view illustrating another example of the substrate with a multilayer reflective film of the present embodiment.

FIG. 2 is a schematic cross-sectional view illustrating another example of the substrate with a multilayer reflective film 100 of the present embodiment. As illustrated in FIG. 2, the protective film 14 may include a Si material layer 16 containing silicon (Si) on a side in contact with the multilayer reflective film 12. That is, the protective film 14 may include the Si material layer 16 on the side in contact with the multilayer reflective film 12 and a RuRh-based layer 18 formed on the Si material layer 16. Similarly to the protective film 14 described above, the RuRh-based layer 18 is a layer containing ruthenium (Ru), rhodium (Rh), and at least one additive element selected from the group consisting of titanium (Ti), zirconium (Zr), yttrium (Y), niobium (Nb), vanadium (V), and hafnium (Hf). The Si material layer 16 is a layer made of a material containing silicon (Si). The Si material layer 16 includes, for example, at least one material selected from the group consisting of silicon (Si), a silicon oxide ($SixO_y$ (x and y are integers of 1 or more) such as SiO, $SiO_2$, or $Si_3O_2$), a silicon nitride ($Si_xN_y$ (x and y are integers of 1 or more) such as SiN or $Si_3N_4$), and a silicon oxynitride ($Si_xO_yN_z$ (x, y, and z are integers of 1 or more) such as SiON). The Si material layer 16 may be a Si film which is a high refractive index layer formed as an uppermost layer of the multilayer reflective film 12 when the multilayer reflective film 12 is a Mo/Si multilayer film and a Mo film and a Si film are layered in this order from the substrate 10 side.

In the substrate with a multilayer reflective film 100 of the present embodiment, the Si material layer 16 may contain a first rare gas element, and the RuRh-based layer 18 may contain a second rare gas element different from the first rare gas element. Each of the first rare gas element and the second rare gas element may contain one rare gas element or two or more rare gas elements. The phrase that the first rare gas element and the second rare gas element are "different" from each other means that at least one rare gas element contained in the first rare gas element is different from at least one rare gas element contained in the second rare gas element.

Each of the first rare gas element and the second rare gas element contains at least one rare gas element selected from the group consisting of helium (He), neon (Ne), argon (Ar), krypton (Kr), and xenon (Xe). Each of the first rare gas element and the second rare gas element preferably contains at least one rare gas element selected from the group consisting of argon (Ar), krypton (Kr), and xenon (Xe).

The second rare gas element may have an atomic weight smaller than the first rare gas element. The term "small" as used herein means that the atomic weight of at least one rare gas element contained in the second rare gas element is smaller than the atomic weight of at least one rare gas element contained in the first rare gas element. For example, such a condition is satisfied when the first rare gas element contains krypton (Kr) and the second rare gas element contains argon (Ar).

In addition, the second rare gas element may have an atomic weight larger than the first rare gas element. The term "large" as used herein means that the atomic weight of at least one rare gas element contained in the second rare gas element is larger than the atomic weight of at least one rare gas element contained in the first rare gas element. For example, such a condition is satisfied when the first rare gas element contains argon (Ar) or krypton (Kr) and the second rare gas element contains xenon (Xe). In addition, such a condition is satisfied when the first rare gas element contains argon (Ar) and krypton (Kr) and the second rare gas element contains argon (Ar) and xenon (Xe).

The multilayer reflective film 12, the Si material layer 16, and the RuRh-based layer 18 may be formed by the same method or may be formed by different methods. For example, after the multilayer reflective film 12 and the Si material layer 16 are continuously formed by an ion beam sputtering method, the RuRh-based layer 18 may be formed by a magnetron sputtering method. In addition, the multilayer reflective film 12 to the RuRh-based layer 18 may be continuously formed by an ion beam sputtering method.

The protective film 14 (the RuRh-based layer 18 when the protective film 14 includes the Si material layer 16 and the RuRh-based layer 18) containing ruthenium (Ru), rhodium (Rh), and the additive element may be a single layer, a multilayer film, or an inclined film. When the protective film 14 (RuRh-based layer 18) is a multilayer film, the protective film 14 (RuRh layer 18) can be a four-to-ten-layered multilayer film in which an additive element layer and a RuRh layer are alternately layered. In this case, a lowermost layer is preferably the additive element layer, and an uppermost layer is preferably the RuRh layer. When the protective film 14 (RuRh-based layer 18) is an inclined film, the content of the additive element is preferably large on the multilayer reflective film 12 side of the protective film 14 (RuRh-based layer 18), and the content of the additive element is preferably small on the absorber film 24 side. When the protective film 14 (RuRh-based layer 18) is the inclined film, the content of Rh is preferably small on the multilayer reflective film 12 side of the protective film 14 (RuRh-based layer 18), and the content of Rh is preferably large on the absorber film 24 side.

Figure 3:
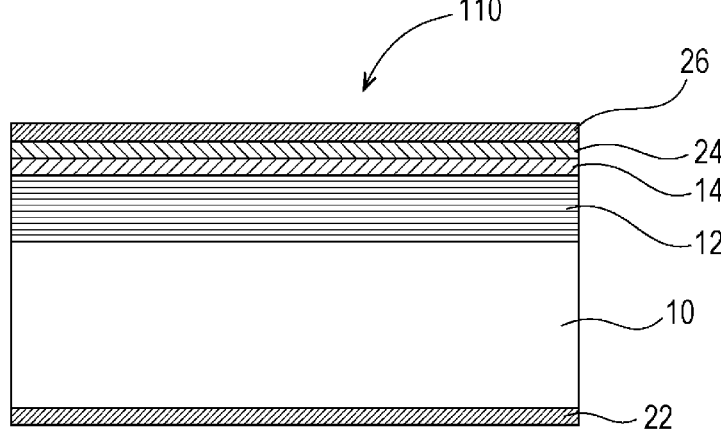
FIG. 3 is a schematic cross-sectional view illustrating an example of a reflective mask blank of the present embodiment.

FIG. 3 is a schematic cross-sectional view illustrating an example of a reflective mask blank 110 of the present embodiment. The reflective mask blank 110 illustrated in FIG. 3 includes the absorber film 24 for absorbing EUV light on the protective film 14 of the above-described substrate with a multilayer reflective film 100. Note that the reflective mask blank 110 can further include another thin film such as a resist film 26 on the absorber film 24.

Figure 4:
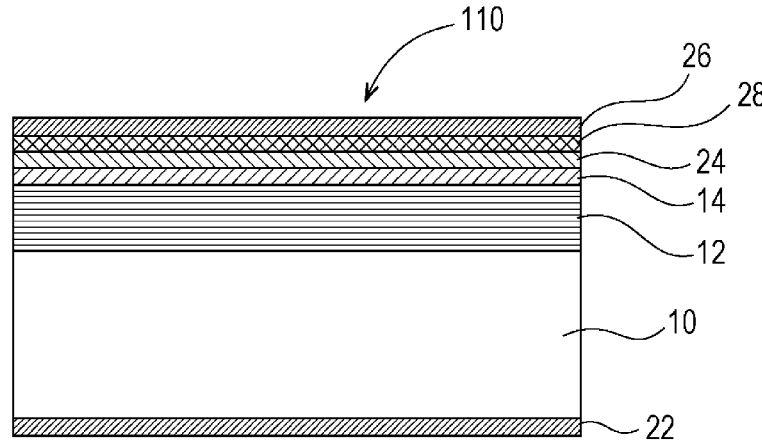
FIG. 4 is a schematic cross-sectional view illustrating another example of the reflective mask blank of the present embodiment.

FIG. 4 is a schematic cross-sectional view illustrating another example of the reflective mask blank 110 of the present embodiment. As illustrated in FIG. 4, the reflective mask blank 110 may include an etching mask film 28 between the absorber film 24 and the resist film 26.

<Absorber Film>

The absorber film 24 of the reflective mask blank 110 of the present embodiment is formed on the protective film 14. A basic function of the absorber film 24 is to absorb EUV light. The absorber film 24 may be the absorber film 24 for the purpose of absorbing EUV light, or may be the absorber film 24 having a phase shift function in consideration of a phase difference of EUV light. The absorber film 24 having a phase shift function absorbs EUV light and reflects a part of the EUV light to shift a phase of the EUV light. That is, in the reflective mask 200 in which the absorber film 24 having a phase shift function is patterned, in a portion where the absorber film 24 is formed, a part of light is reflected at a level that does not adversely affect pattern transfer while EUV light is absorbed and attenuated. In addition, in an area (field portion) where the absorber film 24 is not formed, EUV light is reflected by the multilayer reflective film 12 via the protective film 14. Therefore, a desired phase difference is generated between reflected light from the absorber film 24 having a phase shift function and reflected light from the field portion. The absorber film 24 having a phase shift function is preferably formed such that a phase difference between reflected light from the absorber film 24 and reflected light from the multilayer reflective film 12 is 170 to 190 degrees. Beams of light having a reversed phase difference around 180 degrees interfere with each other at a pattern edge portion to improve an image contrast of a projected optical image. As the image contrast is improved, resolution is increased, and various exposure-related margins such as an exposure margin and a focus margin can be increased.

The absorber film 24 may be a single-layer film or a multilayer film including a plurality of films (for example, a lower layer absorber film and an upper layer absorber film). In a case of a single layer film, since the number of steps at the time of manufacturing a mask blank can be reduced, production efficiency is improved. In a case of a multilayer film, the optical constant of an upper absorber film and the film thickness thereof can be appropriately set such that the upper absorber film serves as an antireflection film at the time of mask pattern defect inspection using light. This improves inspection sensitivity at the time of mask pattern defect inspection using light. In addition, when a film containing oxygen (O), nitrogen (N), and the like that improve oxidation resistance is used as the upper absorber film, temporal stability is improved. As described above, by forming the absorber film 24 into a multilayer film, various functions can be added to the absorber film 24. When the absorber film 24 has a phase shift function, by forming the absorber film 24 into a multilayer film, a range of adjustment on an optical surface can be increased, and therefore a desired reflectance can be easily obtained.

A material of the absorber film 24 is not particularly limited as long as the material has a function of absorbing EUV light, can be processed by etching or the like (preferably, can be etched by dry etching with a chlorine (Cl)-based gas and/or a fluorine (F)-based gas), and has a high etching selective ratio to the protective film 14 (RuRh-based layer 18). As a material having such a function, at least one metal selected from the group consisting of palladium (Pd), silver (Ag), platinum (Pt), gold (Au), iridium (Ir), tungsten (W), chromium (Cr), cobalt (Co), manganese (Mn), tin (Sn), tantalum (Ta), vanadium (V), nickel (Ni), hafnium (Hf), iron (Fe), copper (Cu), tellurium (Te), zinc (Zn), magnesium (Mg), germanium (Ge), aluminum (Al), rhodium (Rh), ruthenium (Ru), molybdenum (Mo), niobium (Nb), titanium (Ti), zirconium (Zr), yttrium (Y), and silicon (Si), or a compound thereof can be preferably used.

The absorber film 24 can be formed by a magnetron sputtering method such as a DC sputtering method or an RF sputtering method. For example, the absorber film 24 such as a tantalum compound can be formed by a reactive sputtering method using a target containing tantalum and boron and using an argon gas containing oxygen or nitrogen.

The tantalum compound for forming the absorber film 24 includes an alloy formed of Ta and the above-described metal. When the absorber film 24 is an alloy of Ta, the crystalline state of the absorber film 24 is preferably an amorphous or microcrystalline structure from a viewpoint of smoothness and flatness. When a surface of the absorber film 24 is not smooth or flat, an absorber pattern 24a may have a large edge roughness and a poor pattern dimensional accuracy. The absorber film 24 has a surface roughness of preferably 0.5 nm or less, more preferably 0.4 nm or less, still more preferably 0.3 nm or less in terms of root mean square roughness (Rms).

Examples of the tantalum compound for forming the absorber film 24 include a compound containing Ta and B, a compound containing Ta and N, a compound containing Ta, O, and N, a compound containing Ta and B and further containing at least either O or N, a compound containing Ta and Si, a compound containing Ta, Si, and N, a compound containing Ta and Ge, a compound containing Ta, Ge, and N, and the like.

Ta is a material that has a large absorption coefficient for EUV light and can be easily dry-etched with a chlorine-based gas or a fluorine-based gas. Therefore, Ta can be said to be a material having excellent processability to be used for the absorber film 24. By further adding B, Si, and/or Ge, or the like to Ta, an amorphous material can be easily obtained. As a result, smoothness of the absorber film 24 can be improved. In addition, when N and/or O is added to Ta, resistance of the absorber film 24 to oxidation is improved, and therefore temporal stability of the absorber film 24 can be improved.

<Conductive Back Film>

The conductive back film 22 for an electrostatic chuck is formed on a second main surface of the substrate 10 (main surface opposite to a side where the multilayer reflective film 12 is formed). Sheet resistance required for the conductive back film 22 for an electrostatic chuck is usually 100Ω/□ (Ω/square) or less. The conductive back film 22 can be formed by, for example, a magnetron sputtering method or an ion beam sputtering method using a target of a metal such as chromium or tantalum or an alloy thereof. A material of the conductive back film 22 is preferably a material containing chromium (Cr) or tantalum (Ta). For example, the material of the conductive back film 22 is preferably a Cr compound containing Cr and at least one selected from the group consisting of boron, nitrogen, oxygen, and carbon. Examples of the Cr compound include CrN, CrON, CrCN, CrCON, CrBN, CrBON, CrBCN, CrBOCN, and the like. In addition, the material of the conductive back film 22 is preferably Ta (tantalum), an alloy containing Ta, or a Ta compound containing either Ta or an alloy containing Ta and at least one selected from the group consisting of boron, nitrogen, oxygen, and carbon. Examples of the Ta compound include TaB, TaN, TaO, TaON, TaCON, TaBN, TaBO, TaBON, TaBCON, TaHf, TaHO, TaHN, TaHON, TaHCON, TaSi, TaSiO, TaSiN, TaSiON, TaSiCON, and the like.

The film thickness of the conductive back film 22 is not particularly limited as long as the conductive back film 22 functions as a film for an electrostatic chuck, but is usually 10 nm to 200 nm. In addition, the conductive back film 22 preferably has a function of adjusting a stress on the second main surface side of the reflective mask blank 110. That is, the conductive back film 22 preferably has a function of adjusting the reflective mask blank 110 so as to be flat by balancing a stress generated by forming a thin film on the first main surface and a stress on the second main surface.

<Etching Mask Film>

The etching mask film 28 may be formed on the absorber film 24. As a material of the etching mask film 28, a material with which an etching selective ratio of the absorber film 24 to the etching mask film 28 is high is preferably used. The etching selective ratio of the absorber film 24 to the etching mask film 28 is preferably 1.5 or more, and more preferably 3 or more.

The reflective mask blank 110 of the present embodiment preferably includes the etching mask film 28 containing chromium (Cr) on the absorber film 24. When the absorber film 24 is etched with a fluorine-based gas, chromium or a chromium compound is preferably used as the material of the etching mask film 28. Examples of the chromium compound include a material containing Cr and at least one element selected from the group consisting of N, O, C, and H. The etching mask film 28 more preferably contains CrN, CrO, CrC, CrON, CrOC, CrCN, or CrOCN, and still more preferably is a CrO-based film (CrO film, CrON film, CrOC film, or CrOCN film) containing chromium and oxygen.

Since the protective film 14 has the above-described structure containing ruthenium (Ru), rhodium (Rh), and the additive element, it is possible to suppress damage to the protective film 14 when the etching mask film 28 containing chromium (Cr) is removed by dry etching with a mixed gas of a chlorine-based gas and an oxygen gas.

When the absorber film 24 is etched with a chlorine-based gas substantially containing no oxygen, silicon or a silicon compound is preferably used as the material of the etching mask film 28. Examples of the silicon compound include a material containing Si and at least one element selected from the group consisting of N, O, C, and H, a metallic silicon containing silicon or a silicon compound and a metal (metal silicide), a metal silicon compound (metal silicide compound), and the like. Examples of the metal silicon compound include a material containing a metal, Si, and at least one element selected from the group consisting of N, O, C, and H.

Since the protective film 14 has the above-described structure containing ruthenium (Ru), rhodium (Rh), and the additive element, it is possible to suppress damage to the protective film 14 when the etching mask film 28 containing silicon is removed by dry etching with a fluorine-based gas.

The film thickness of the etching mask film 28 is preferably 3 nm or more in order to accurately form a pattern on the absorber film 24. In addition, the film thickness of the etching mask film 28 is preferably 15 nm or less in order to reduce the film thickness of the resist film 26.

<Reflective Mask>

Using the reflective mask blank 110 of the present embodiment, the reflective mask 200 of the present embodiment can be manufactured. Hereinafter, an example of a method for manufacturing the reflective mask will be described.

FIGS. 5A to 5E are schematic views illustrating an example of a method for manufacturing the reflective mask 200.

Figure 5A:
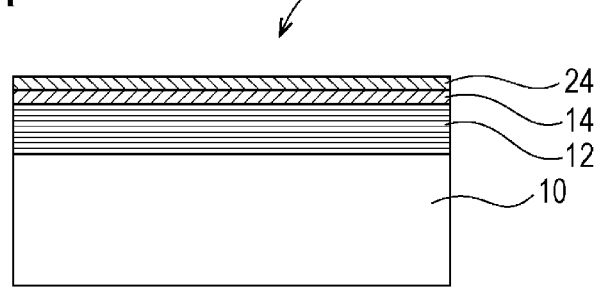
FIGS. 5A to 5E are schematic views illustrating an example of a method for manufacturing a reflective mask.
Figure 5B:
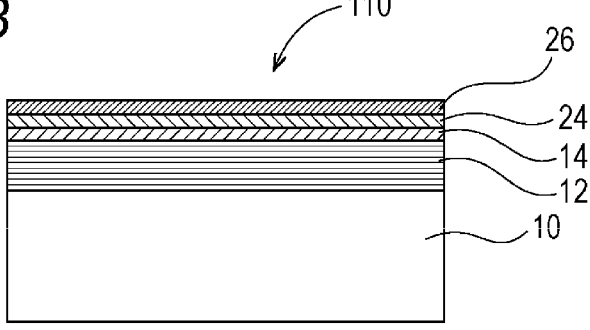
Figure 5C:
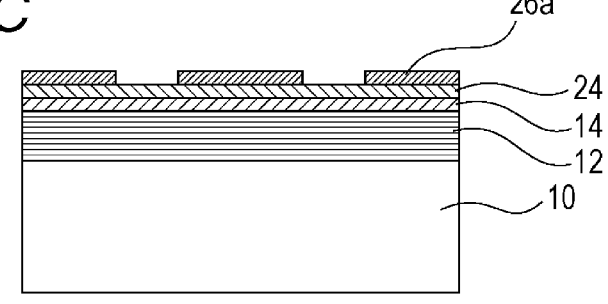

As illustrated in FIG. 5A, first, the reflective mask blank 110 including the substrate 10, the multilayer reflective film 12 formed on the substrate 10, the protective film 14 formed on the multilayer reflective film 12, and the absorber film 24 formed on the protective film 14 is prepared (FIG. 5A). Next, the resist film 26 is formed on the absorber film 24 (FIG. 5B). A pattern is drawn on the resist film 26 with an electron beam drawing device, and then the resulting product is further developed and rinsed to form a resist pattern 26a (FIG. 5C).

Figure 5D:
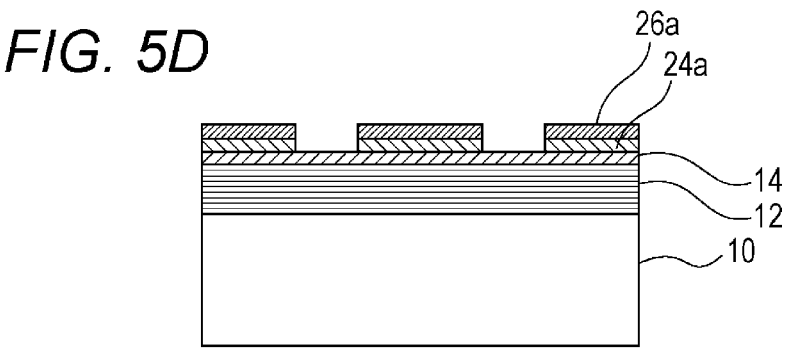

The absorber film 24 is dry-etched using the resist pattern 26a as a mask. As a result, a portion not covered with the resist pattern 26a in the absorber film 24 is etched to form the absorber pattern 24a (FIG. 5D).

As the etching gas of the absorber film 24, for example, a fluorine-based gas and/or a chlorine-based gas can be used. As the fluorine-based gas, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, or the like can be used. As the chlorine-based gas, $Cl_2$, $SiCl_4$, $CHCl_3$, $CCl_4$, $BCl_3$, or the like can be used. In addition, a mixed gas containing a fluorine-based gas and/or a chlorine-based gas and $O_2$ at a predetermined ratio can be used. These etching gases can each further contain an inert gas such as He and/or Ar, if necessary.

Figure 5E:
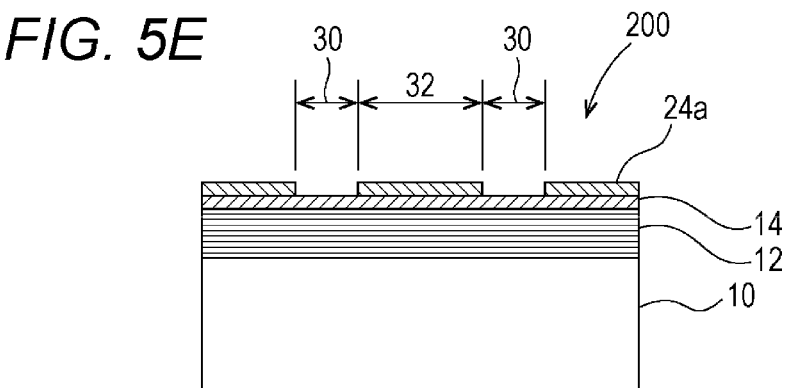

After the absorber pattern 24a is formed, the resist pattern 26a is removed with a resist peeling liquid. After the resist pattern 26a is removed, the resulting product is subjected to a wet cleaning step using an acidic or alkaline aqueous solution to obtain the reflective mask 200 of the present embodiment (FIG. 5E).

Note that when the reflective mask blank 110 in which the etching mask film 28 is formed on the absorber film 24 is used, a step of forming a pattern (etching mask pattern) on the etching mask film 28 using the resist pattern 26a as a mask and then forming a pattern on the absorber film 24 using the etching mask pattern as a mask is added.

The reflective mask 200 thus obtained has a structure in which the multilayer reflective film 12, the protective film 14, and the absorber pattern 24a are layered on the substrate 10.

An area 30 where the multilayer reflective film 12 (including the protective film 14) is exposed has a function of reflecting EUV light. An area 32 in which the multilayer reflective film 12 (including the protective film 14) is covered with the absorber pattern 24a has a function of absorbing EUV light. According to the reflective mask 200 of the present embodiment, since the thickness of the absorber pattern 24a having a reflectance of, for example, 2.5% or less can be made thinner than before, a finer pattern can be transferred onto a transferred object.

<Method for Manufacturing Semiconductor Device>

A transfer pattern can be formed on a semiconductor substrate by lithography using the reflective mask 200 of the present embodiment. This transfer pattern has a shape obtained by transferring a pattern of the reflective mask 200. By forming a transfer pattern on a semiconductor substrate with the reflective mask 200, a semiconductor device can be manufactured.

A method for transferring a pattern onto a semiconductor substrate 56 with resist using EUV light will be described with reference to FIG. 6.

Figure 6:
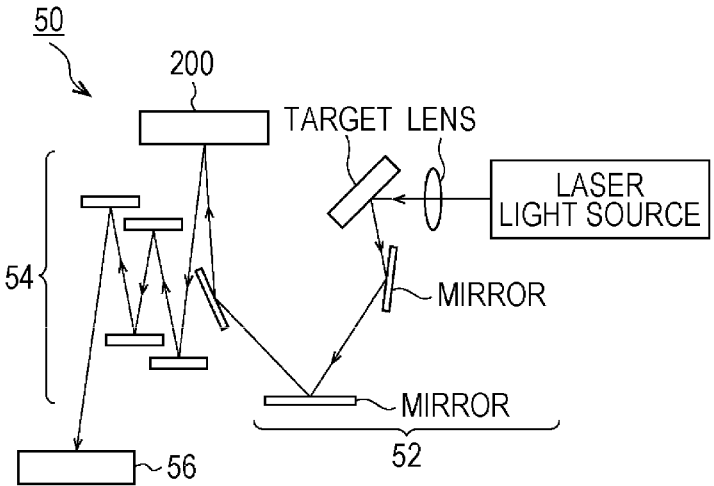
FIG. 6 is a schematic diagram illustrating a pattern transfer device.

FIG. 6 illustrates a pattern transfer device 50. The pattern transfer device 50 includes a laser plasma X-ray source 52, the reflective mask 200, a reduction optical system 54, and the like. As the reduction optical system 54, an X-ray reflection mirror is used.

A pattern reflected by the reflective mask 200 is usually reduced to about ¼ by the reduction optical system 54. For example, a wavelength band of 13 to 14 nm is used as a light exposure wavelength, and an optical path is set in advance so as to be in a vacuum. Under such conditions, EUV light generated by the laser plasma X-ray source 52 is allowed to enter the reflective mask 200. Light reflected by the reflective mask 200 is transferred onto the semiconductor substrate 56 with resist via the reduction optical system 54.

The light reflected by the reflective mask 200 enters the reduction optical system 54. The light that has entered the reduction optical system 54 forms a transfer pattern on a resist layer on the semiconductor substrate 56 with resist. By developing the resist layer that has been exposed to light, a resist pattern can be formed on the semiconductor substrate 56 with resist. By etching the semiconductor substrate 56 using this resist pattern as a mask, for example, a predetermined wiring pattern can be formed on the semiconductor substrate. A semiconductor device is manufactured through such a step and other necessary steps.

EXAMPLES

Hereinafter, Examples and Comparative Example will be described with reference to the drawings.

(Substrate with a Multilayer Reflective Film 100)

First, a substrate 10 which had a 6025 size (about 152 mm×152 mm×6.35 mm) and in which a first main surface and a second main surface had been polished was prepared. The substrate 10 is a substrate made of low thermal expansion glass ($SiO_2$—$TiO_2$-based glass). The main surfaces of the substrates 10 were polished through a rough polishing step, a precision polishing step, a local processing step, and a touch polishing step.

Next, the multilayer reflective film 12 was formed on the main surface (first main surface) of the substrate 10. The multilayer reflective film 12 formed on the substrate 10 was a periodic multilayer reflective film 12 containing Mo and Si in order to make the multilayer reflective film 12 suitable for EUV light having a wavelength of 13.5 nm. The multilayer reflective film 12 was formed using a Mo target and a Si target by alternately building up a Mo layer and a Si layer on the substrate 10 by an ion beam sputtering method using krypton (Kr) as a process gas. First, a Si film was formed so as to have a thickness of 4.2 nm, and subsequently a Mo film was formed so as to have a thickness of 2.8 nm. This stack of a Si film and a Mo film was counted as one period, and a Si film and a Mo film were built up for 40 periods in a similar manner to form the multilayer reflective film 12.

Next, the Si material layer 16 was formed on the multilayer reflective film 12. The multilayer reflective film 12 and the Si material layer 16 were continuously formed by an ion beam sputtering method. For the Si material layer 16, a Si film having a thickness of 4.0 nm was formed using a Si target and krypton (Kr) as a process gas.

Next, the RuRh-based layer 18 or a Ru film was formed on the Si material layer 16. The RuRh-based layer 18 or the Ru film was formed so as to have the film thickness presented in Table 1 by a magnetron sputtering method in an Ar gas atmosphere using a target having the composition presented in Table 1. The composition of the formed protective film 14 was measured by X-ray photoelectron spectroscopy (XPS).

Table 1 presents the composition and film thickness of the protective film 14 (RuRh-based layer 18 or Ru film) in Examples and Comparative Example.

(Reflective Mask Blank 110)

The reflective mask blank 110 including the absorber film 24 was manufactured using the above-described substrate with a multilayer reflective film 100. Hereinafter, a method for manufacturing the reflective mask blank 110 will be described.

The absorber film 24 was formed on the protective film 14 of the substrate with a multilayer reflective film 100 by a DC magnetron sputtering method. The absorber film 24 was the absorber film 24 of a layered film including two layers of a TaN film as an absorption layer and a TaO film as a low reflection layer. On a surface of the protective film 14 of the above-described substrate with a multilayer reflective film 100, a TaN film was formed as an absorption layer by a DC magnetron sputtering method. The TaN film was formed by a reactive sputtering method in a mixed gas atmosphere of an Ar gas and a $N_2$ gas with the substrate with a multilayer reflective film 100 facing a Ta target. Next, a TaO film (low reflection layer) was further formed on the TaN film by a DC magnetron sputtering method. Similarly to the TaN film, this TaO film was formed by a reactive sputtering method in a mixed gas atmosphere of Ar and $O_2$ with the substrate with a multilayer reflective film 100 facing a Ta target.

The composition (atomic ratio) of the TaN film was Ta:N=70:30, and the film thickness thereof was 48 nm. In addition, the composition (atomic ratio) of the TaO film was Ta:O=35:65, and the film thickness thereof was 11 nm.

Next, the conductive back film 22 made of CrN was formed on the second main surface (back main surface) of the substrate 10 by a magnetron sputtering method (reactive sputtering) method under the following conditions.

Conditions for forming the conductive back film 22: a Cr target, a mixed gas atmosphere of Ar and $N_2$ (Ar: 90 atomic %, N: 10 atomic %), and a film thickness of 20 nm.

As described above, the reflective mask blanks 110 of Examples 1 to 6 and Comparative Example 1 were manufactured.

tance before and after etching the absorber film 24 was evaluated. In addition, the reflective mask 200 was set in an EUV exposure apparatus, and it was evaluated whether or not blister occurred when a pattern was transferred onto a semiconductor substrate in an atmosphere containing hydrogen.

Specifically, before the absorber film 24 was formed on a surface of the protective film 14 of the substrate with a multilayer reflective film 100, a reflectance (reflectance before etching) of the surface of the protective film 14 with respect to EUV light having a wavelength of 13.5 nm was measured. In addition, after the absorber pattern 24a was formed by etching the absorber film 24, a reflectance (reflectance after etching) of the surface of the protective film 14 not covered with the absorber pattern 24a was similarly measured. Table 1 presents a change in reflectance before and after etching of the surface of the protective film 14 (absolute value of difference between reflectance before etching and reflectance after etching).

In addition, whether or not blister occurred was confirmed by taking out the reflective mask 200 from the exposure apparatus and then observing a cross section of the reflective mask 200 with an electron microscope. Cross-sections at 10 arbitrary positions were observed, and when at least one occurrence of blister was confirmed, it was determined that blister "occurred".

TABLE 1

| | Protective film (RuRh-based layer) | | | |
| | Composition | Film thickness (nm) | Change in reflectance | Whether or not blister occurred |
| --- | --- | --- | --- | --- |
| Example 1 | RuRhTi (70:25:5) | 3.5 | 0.80 | Not occurred |
| Example 2 | RuRhTi (70:27:3) | 3.5 | 0.70 | Not occurred |
| Example 3 | RuRhZr (70:25:5) | 3.5 | 0.75 | Not occurred |
| Example 4 | RuRhZr (70:27:3) | 3.5 | 0.65 | Not occurred |
| Example 5 | RuRhV (70:25:5) | 3.5 | 0.75 | Not occurred |
| Example 6 | RuRhNb (60:20:20) | 3.5 | 0.75 | Not occurred |
| Comparative Example 1 | Ru | 2.5 | 0.85 | Occurred |

(Reflective Mask 200)

Next, the reflective mask 200 was manufactured using the above-described reflective mask blank 110. The manufacture of the reflective mask 200 will be described with reference to FIGS. 5A to 5E.

First, as illustrated in FIG. 5B, the resist film 26 was formed on the absorber film 24 of the reflective mask blank 110. Then, a desired pattern such as a circuit pattern was drawn (exposed) on the resist film 26 and further developed and rinsed to form the predetermined resist pattern 26a (FIG. 5C). Next, using the resist pattern 26a as a mask, the TaO film (low reflection layer) of the absorber film 24 was dry-etched using a $CF_4$ gas, and subsequently the TaN film was dry-etched using a $Cl_2$ gas to form the absorber pattern 24a (FIG. 5D).

Thereafter, the resist pattern 26a was peeled off by oxygen ashing. Finally, wet cleaning was performed with deionized water (DIW) to manufacture the reflective masks 200 of Examples 1 to 6 and Comparative Example 1.

(Evaluation of Reflective Masks 200 of Examples and Comparative Example)

For each of the above-described reflective masks 200 of Examples and Comparative Example, a change in reflec- As can be seen from the results presented in Table 1, in each of the reflective masks 200 of Examples 1 to 6, a change in reflectance before and after etching of the absorber film 24 was small. In addition, even after the reflective mask 200 was set in the exposure apparatus and the pattern was transferred onto the semiconductor substrate in an atmosphere containing hydrogen, occurrence of blister was not confirmed between the protective film 14 and the absorber pattern 24a or between the protective film 14 and the multilayer reflective film 12.

In the reflective mask 200 of Comparative Example 1, a change in reflectance before and after etching of the absorber film 24 was small. However, occurrence of blister was confirmed between the protective film 14 and the absorber pattern 24a and between the protective film 14 and the multilayer reflective film 12.

REFERENCE SIGNS LIST

10 Substrate
12 Multilayer reflective film
14 Protective film

16 Si material layer
18 RuRh-based layer
22 Conductive back film
24 Absorber film
26 Resist film
28 Etching mask film
100 Substrate with a multilayer reflective film
110 Reflective mask blank
200 Reflective mask

The invention claimed is:

1. A substrate with a multilayer reflective film comprising: a substrate, a multilayer reflective film formed on the substrate, and a protective film formed on the multilayer reflective film, wherein:

the protective film comprises ruthenium (Ru), rhodium (Rh), and at least one additive element selected from the group consisting of titanium (Ti), zirconium (Zr), yttrium (Y), niobium (Nb), vanadium (V), and hafnium (Hf), and a content of the rhodium (Rh) is 15 atomic % or more and 50 atomic % or less.

2. The substrate with a multilayer reflective film according to claim 1, wherein the protective film comprises a Si material layer comprising silicon (Si) on a side in contact with the multilayer reflective film.

3. The substrate with a multilayer reflective film according to claim 1, wherein a content of the at least one additive element is 1 atomic % or more and 20 atomic % or less.

4. A substrate with a multilayer reflective film comprising: a substrate, a multilayer reflective film formed on the substrate, and a protective film formed on the multilayer reflective film, wherein:

the protective film comprises ruthenium (Ru), rhodium (Rh), and at least one additive element selected from the group consisting of titanium (Ti), zirconium (Zr), yttrium (Y), niobium (Nb), vanadium (V), and hafnium (Hf), and a content of the at least one additive element is 1 atomic % or more and 20 atomic % or less.

5. The substrate with a multilayer reflective film according to claim 4, wherein:

the at least one additive element is at least one selected from titanium (Ti), zirconium (Zr), yttrium (Y), and vanadium (V), and the content of the at least one additive element is 1 atomic % or more and 10 atomic % or less.

6. The substrate with a multilayer reflective film according to claim 4, wherein:

the at least one additive element is niobium (Nb), and a content of the Nb is 1 atomic % or more and 15 atomic % or less.

7. A reflective mask blank comprising:

a substrate, a multilayer reflective film formed on the substrate, a protective film formed on the multilayer reflective film, and an absorber film on the protective film, wherein:

the protective film comprises ruthenium (Ru), rhodium (Rh), and at least one additive element selected from the group consisting of titanium (Ti), zirconium (Zr), yttrium (Y), niobium (Nb), vanadium (V), and hafnium (Hf), and a content of the rhodium (Rh) is 15 atomic % or more and 50 atomic % or less.

8. The reflective mask blank according to claim 7, wherein the protective film comprises a Si material layer comprising silicon (Si) on a side in contact with the multilayer reflective film.

9. The reflective mask blank according to claim 7, wherein a content of the at least one additive element is 1 atomic % or more and 20 atomic % or less.

10. A reflective mask comprising:

a substrate, a multilayer reflective film formed on the substrate, a protective film formed on the multilayer reflective film, and an absorber pattern in which an absorber film is patterned, wherein:

the protective film comprises ruthenium (Ru), rhodium (Rh), and at least one additive element selected from the group consisting of titanium (Ti), zirconium (Zr), yttrium (Y), niobium (Nb), vanadium (V), and hafnium (Hf), and a content of the rhodium (Rh) is 15 atomic % or more and 50 atomic % or less.

11. A method for manufacturing a semiconductor device, comprising performing a lithography process using an exposure apparatus using the reflective mask according to claim 10 to form a transfer pattern on a transferred object.

12. The reflective mask according to claim 10, wherein the protective film comprises a Si material layer comprising silicon (Si) on a side in contact with the multilayer reflective film.

13. The reflective mask according to claim 10, wherein a content of the at least one additive element is 1 atomic % or more and 20 atomic % or less.

14. A reflective mask blank comprising:

a substrate, a multilayer reflective film formed on the substrate, a protective film formed on the multilayer reflective film; and an absorber film on the protective film, wherein:

the protective film comprises ruthenium (Ru), rhodium (Rh), and at least one additive element selected from the group consisting of titanium (Ti), zirconium (Zr), yttrium (Y), niobium (Nb), vanadium (V), and hafnium (Hf), and a content of the at least one additive element is 1 atomic % or more and 20 atomic % or less.

15. The reflective mask blank according to claim 14, wherein the at least one additive element is at least one selected from titanium (Ti), zirconium (Zr), yttrium (Y), and vanadium (V), and the content of the at least one additive element is 1 atomic % or more and 10 atomic % or less.

16. The reflective mask blank according to claim 14, wherein the at least one additive element is niobium (Nb), and a content of the Nb is 1 atomic % or more and 15 atomic % or less.

17. A reflective mask comprising:

a substrate, a multilayer reflective film formed on the substrate, a protective film formed on the multilayer reflective film; and an absorber pattern in which an absorber film is patterned, wherein:

the protective film comprises ruthenium (Ru), rhodium (Rh), and at least one additive element selected from the group consisting of titanium (Ti), zirconium (Zr), yttrium (Y), niobium (Nb), vanadium (V), and hafnium (Hf), and a content of the at least one additive element is 1 atomic % or more and 20 atomic % or less.

18. The reflective mask according to claim 17, wherein:

the at least one additive element is at least one selected from titanium (Ti), zirconium (Zr), yttrium (Y), and vanadium (V), and the content of the at least one additive element is 1 atomic % or more and 10 atomic % or less.

19. The reflective mask according to claim 17, wherein the at least one additive element is niobium (Nb), and a content of the Nb is 1 atomic % or more and 15 atomic % or less.

\* \* \* \* \*